I

(12) United States Patent
Park et al.

(10) Patent No.: US 8,354,910 B2
(45) Date of Patent: Jan. 15, 2013

(54) COIL BLOCK AND ELECTRONIC DEVICE USING THE SAME

(75) Inventors: Kyu-eun Park, Suwon-si (KR); Dae-kyoung Noh, Suwon-si (KR); Sung-woo Kim, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 899 days.

(21) Appl. No.: 11/723,464

(22) Filed: Mar. 20, 2007

(65) Prior Publication Data

US 2008/0024250 A1 Jan. 31, 2008

(30) Foreign Application Priority Data

Jul. 28, 2006 (KR) .................. 10-2006-0071771
Nov. 6, 2006 (KR) .................. 10-2006-0108965

(51) Int. Cl.
*H01F 38/12* (2006.01)
*H01F 27/36* (2006.01)
*H01F 27/02* (2006.01)
*H01F 27/28* (2006.01)
*H01F 27/30* (2006.01)
*H01F 27/24* (2006.01)
*H01F 17/04* (2006.01)

(52) U.S. Cl. ...... 336/84 M; 336/83; 336/84 R; 336/182; 336/183; 336/184; 336/208; 336/212; 336/220; 336/221

(58) Field of Classification Search .................. 336/83, 336/84 R, 84 M, 110, 182–184, 208, 212, 336/219–221; 315/400
See application file for complete search history.

(56) References Cited

U.S. PATENT DOCUMENTS 3,996,537 A 12/1976 Neuman
4,841,407 A * 6/1989 Baba et al. .................. 361/146
5,635,891 A 6/1997 Miyoshi et al.
5,793,273 A 8/1998 Yamaguchi et al.
5,999,066 A * 12/1999 Saito et al. .................. 333/132
6,396,542 B1 * 5/2002 Patel ........................... 348/445
6,483,409 B1 * 11/2002 Shikama et al. ............ 336/83
2004/0150500 A1 * 8/2004 Kiko ............................ 336/90
2005/0151585 A1 * 7/2005 Honda et al. ................ 330/10

FOREIGN PATENT DOCUMENTS

| JP | 03231404 A | * | 10/1991 |
| JP | 04338613 A | * | 11/1992 |
| JP | 09007844 A | * | 1/1997 |
| JP | 10-135864 A | | 5/1998 |
| JP | 2003133139 A | * | 5/2003 |
| KR | 10-2003-0030918 A | | 4/2003 |
| KR | 1020040079617 A | | 9/2004 |

* cited by examiner

*Primary Examiner* — Mohamad Musleh
*Assistant Examiner* — Tsz Chan
(74) *Attorney, Agent, or Firm* — Sughrue Mion, PLLC (57) ABSTRACT

A coil block and an electronic device using the same are provided. The coil block includes a first coil, a second coil, a core having an intermediate layer for separating the first coil and the second coil from each other, and a shield for shielding the first coil, the second coil, and the intermediate layer, wherein the first coil and the second coil have the same winding direction. According to the coil block and the electronic device, the filtering can be performed without any inductance offset even if the PWM signal having the inversed phase or the same phase is inputted. Also, since two windings can be wound on to one core using a common coil, the cost and the size of the coil block can be reduced.

41 Claims, 10 Drawing Sheets

→ FLOW OF CURRENT
----▶ FLOW OF MAGNETIC FORCE

A : PATH OF Φm

FIG. 4

Ls : SELF INDUCTANCE
Lm : MUTUAL INDUCTANCE OF COMMON COIL

COIL BLOCK AND ELECTRONIC DEVICE USING THE SAME

CROSS-REFERENCE TO RELATED APPLICATIONS

This application claims benefit under 35 U.S.C. §119(a) of Korean Patent Application Nos. 2006-71771 and 2006-108965, filed Jul. 28, 2006 and Nov. 6, 2006, in the Korean Intellectual Property Office, the entire contents of which are hereby incorporated by reference.

BACKGROUND OF THE INVENTION

1. Field of the Invention

The present invention relates to a coil block and an electronic device using the same. More particularly, the present invention relates to a coil block and an electronic device using the same, which can provide an inductance component to an element that requires inductance.

2. Description of the Related Art

Figure 2A:
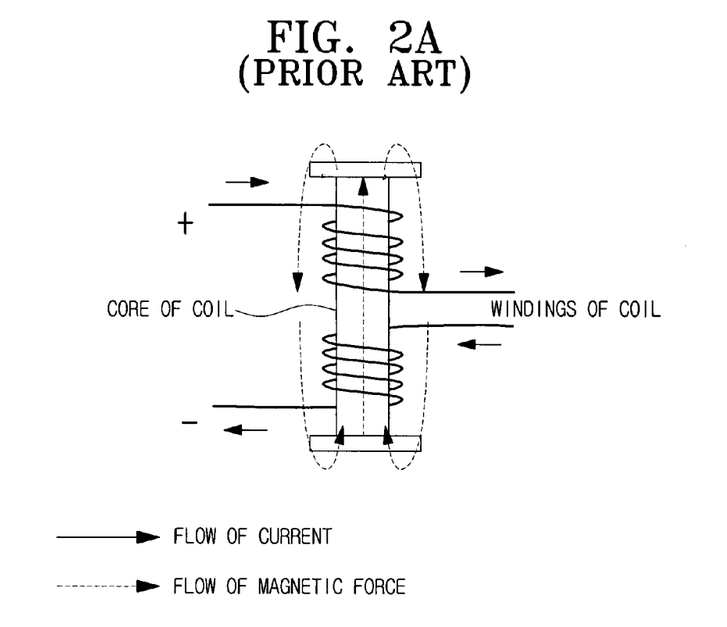
FIGS. 2A and 2D are views illustrating the structure of an LC filter using a conventional common coil.
Figure 2B:
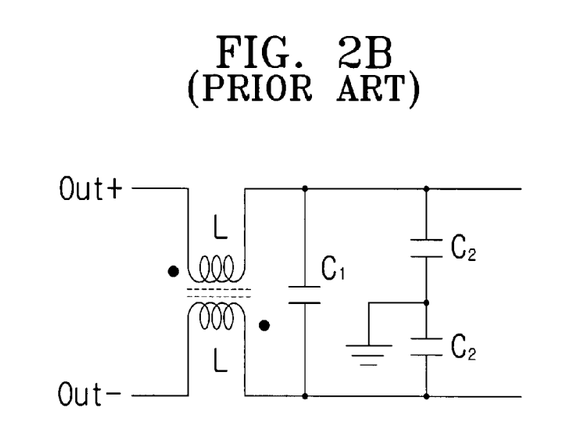
FIGS. 2B and 2C are circuit diagrams schematically illustrating the construction of a common coil filter.
Figure 2C:
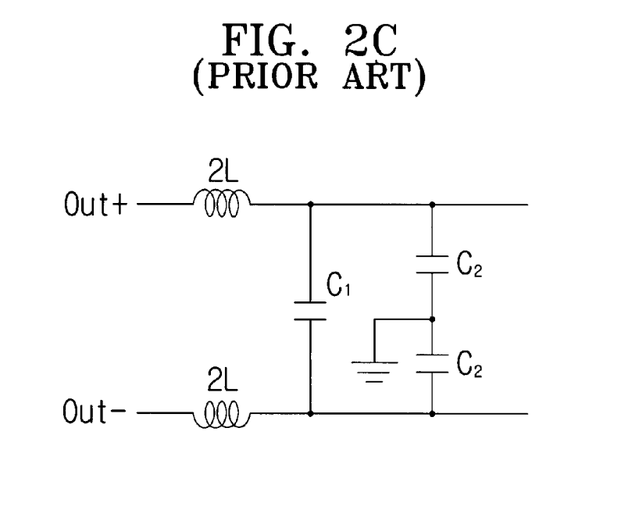

Generally, an LC filter used in a digital amplifier includes a coil L and a capacitor C. This coil, as shown in FIG. 2A, is composed of a core and a wiring, and is connected in series to outputs Out+ and Out− of the digital amplifier. The capacitor, as shown in FIGS. 2B and 2C, is composed of a capacitor C1 positioned at both ends of two coils and a capacitor C2 positioned between one of the coils and ground.

In addition, the LC filter used at the output terminals of the digital amplifier serves to restore to the original signal by low-pass-filtering high-band components of a pulse width modulation (PWM) signal. Here, at shown in FIG. 1A, the PWM signal can be expressed as a difference between two positive (+) and negative (−) signals, and the magnitude of the original signal can be indicated using the difference in pulse width between the two signals. If the magnitude of the original signal is varied, the pulse width of the PWM signal is simultaneously varied, in various ways as shown in FIGS. 1A, 1B, and 1C, according to its PWM modulation method.

Figure 1A:
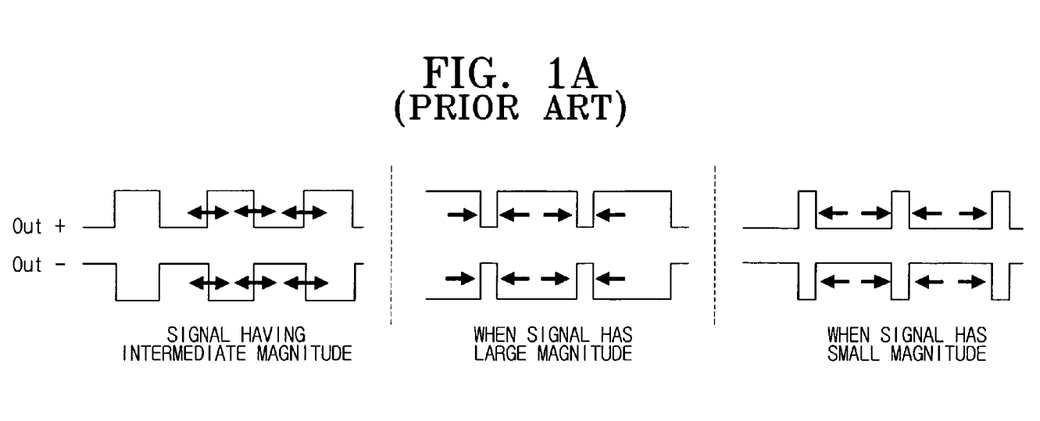
FIGS. 1A, 1B, and 1C are views illustrating waveforms of PWM signals applied to an LC filter circuit of a digital amplifier.
Figure 1B:
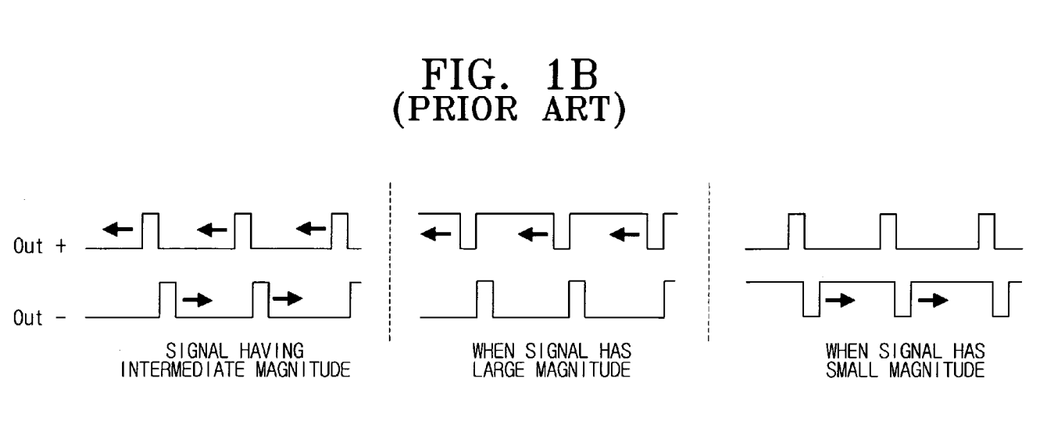
Figure 1C:
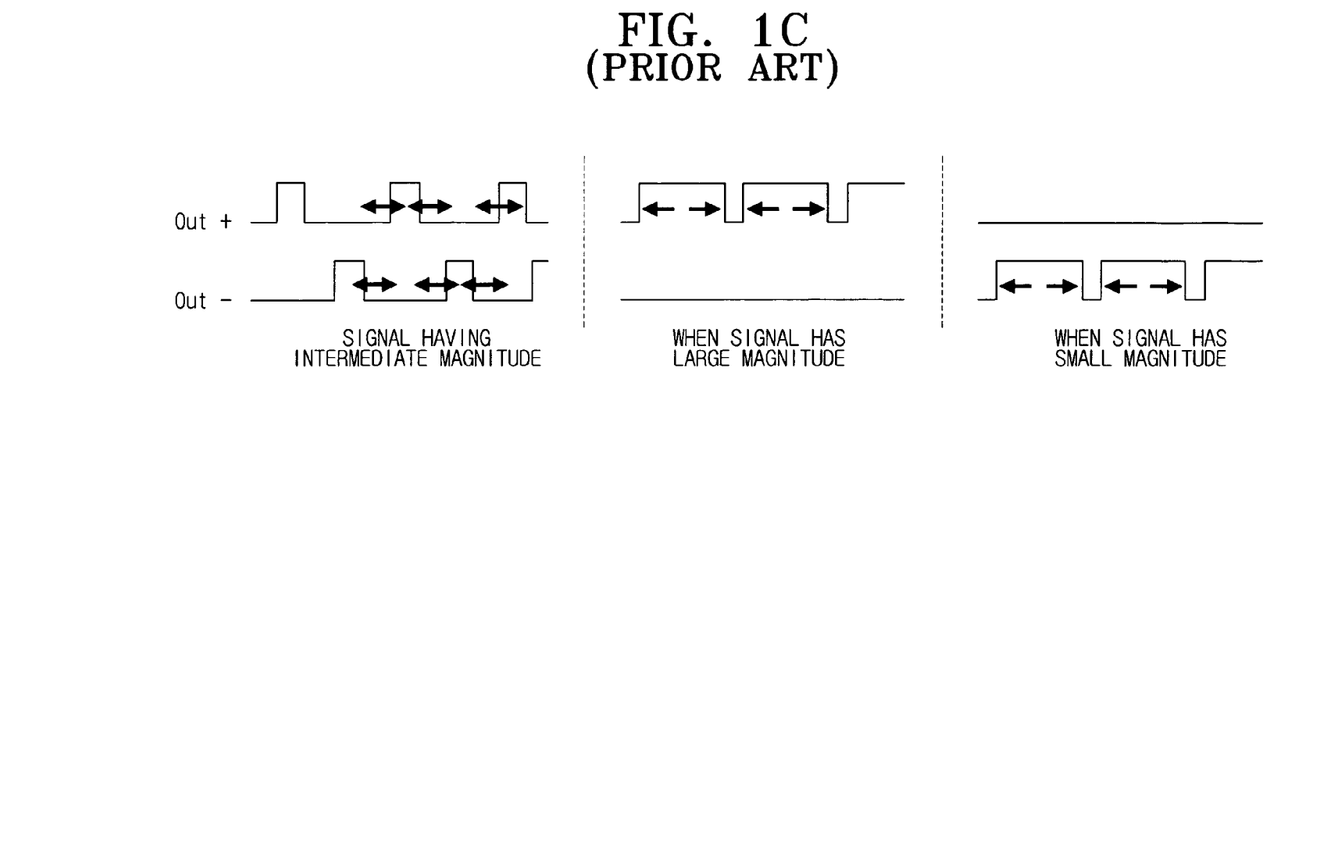

In this case, if the PWM signal always has an inversed phase structure as shown in FIG. 1A, a common coil, where two windings are wound on to one core in a direction in which magnetic forces of the two windings overlap each other, may be used as shown in FIG. 2A.

If current flows in different directions through the two windings that are wound on to one core in the common coil as shown in FIG. 2A, magnetic forces having the same direction are produced through the windings, so that the coil performs a normal operation, which is a well known technology.

In this case, the inductance value L for one coil is in proportion to the square of the number of turns of the windings as shown in Equation (1), and thus if it is assumed that the number of turns of one winding in the common coil is n, the total number of turns for current flow becomes 2n. Thus, if it is assumed that the respective inductance of the common coil is L, the whole inductance of the coil becomes 4L. Accordingly, if the common coil having the individual inductance value of L, as shown in FIGS. 2B and 2C, is used, it has the effect of using two general coils having the inductance of 2L.

$$L = \mu_0 n^2 Al \quad (1)$$

Here, $\mu_0$ denotes a magnetic permeability, n the number of turns, and Al the volume of the coil, respectively.

Figure 2D:
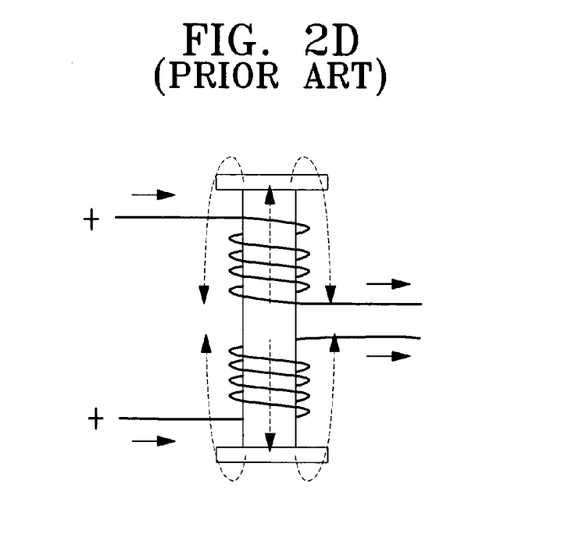

On the other hand, if the PWM signal has both an inversed phase component and a same phase component as shown in FIGS. 2B and 2C, current flows in the same direction as the current flow through the two coils at a point of the same phase where the current flows in the same direction through the two windings, as shown in FIG. 2D.

In this case, since the two windings are wound in the same direction, the directions of the magnetic forces thereof become opposite to each other. Accordingly, the magnetic forces offset each other, resulting in that the inductance of the coil becomes "0". If the inductance of the coil becomes "0", a direct charging/discharging of a capacitor C2 is performed to cause the occurrence of a transient phenomenon due to overcurrent. If the capacitor C2 is removed, the transient phenomenon does not occur any more, but the PWM component of the same phase is not removed to cause a noise component not to be cut off.

In addition, although coils used in an LC filter are passive elements, they are large-sized and expensive, unlike resistors and capacitors, developers' dissatisfaction has been increased. Accordingly, developers of digital amplifiers have continuously made an investment in reduction of the size of coils, and have introduced a common coil as the result. In an early stage of digital amplifiers, PWM signal had an inversed phase only, and thus the common coil was satisfactorily used. However, with the development of technology, digital amplifiers, which use a PWM method that has components of the same phase to achieve more efficient control, have been increasingly used. In this case, since two general coils should be separately used instead of the common coil, damage rather occurs in size and cost of the digital amplifier.

SUMMARY OF THE INVENTION

Exemplary embodiments of the present invention address at least the above problems and disadvantages and provide at least the advantages described below. Accordingly, an aspect of exemplary embodiments of the present invention provide a coil block and an electronic device using the same, which can prevent magnetic flux from being offset even if a pulse width modulation (PWM) signal having not only an inversed phase component but also a same phase component is applied.

According to exemplary embodiments of the present invention, a coil block according to embodiments of the present invention comprises a first coil, a second coil, a core having an intermediate layer for separating the first coil and the second coil from each other, and a shield for shielding the first coil, the second coil, and the intermediate layer, wherein the first coil and the second coil have the same winding direction.

The shield and the intermediate layer may be generally or partly apart from each other.

The shield may be in the form of a square pillar.

The first coil and the second coil may have the same inductance. Also, the first coil and the second coil may have different inductances from each other.

The intermediate layer and the core may be made of the same material. Also, the intermediate layer and the core may be formed in a body. The intermediate layer may be made of an electromagnetic shielding material.

The shield may be made of the same material as the core. Also, the shield may be made of an electromagnetic shielding material.

If directions of current being applied to the first coil and the second coil are equal to each other, a part of magnetic force may be applied through a predetermined gap between the shield and the intermediate layer to be offset, and another part of the magnetic force may cause generation of self inductance between the shield and the first coil and between the shield and the second coil.

The magnitude of inductance may be controlled according to the size of the gap between the shield and the intermediate layer.

The magnitude of inductance may be controlled according to an area of a magnetic force flow path of the first coil and the second coil.

According to exemplary embodiments of the present invention, a coil block comprises a first coil, a second coil, a core having an intermediate layer for separating the first coil and the second coil from each other, and a shield for shielding the first coil, the second coil, and the intermediate layer, wherein the shield is attached to a specified part of the core.

The shield may be attached to an upper plate provided on the core. Also, the shield may be attached to an edge of a lower surface of the upper plate. The area of the upper plate may be larger than that of a lower plated provided on the core.

The shield and the intermediate layer may be generally or partly apart from each other.

The shield may be in the form of a square pillar.

The first coil and the second coil may have the same inductance. Also, the first coil and the second coil may have different inductances from each other.

The intermediate layer and the core may be made of the same material. Also, the intermediate layer and the core may be formed in a body. The intermediate layer may be made of an electromagnetic shielding material.

The shield may be made of the same material as the core. Also, the shield may be made of an electromagnetic shielding material.

If directions of current being applied to the first coil and the second coil are equal to each other, a part of magnetic force may be applied through a predetermined gap between the shield and the intermediate layer to be offset, and another part of the magnetic force may cause generation of self inductance between the shield and the first coil and between the shield and the second coil.

The magnitude of inductance may be controlled according to the size of the gap between the shield and the intermediate layer.

The magnitude of inductance may be controlled according to an area of a magnetic force flow path of the first coil and the second coil.

According to still another aspect of embodiments of the present invention, there is provided a filtering device, which comprises a coil block having a first coil, a second coil, a core having an intermediate layer for separating the -first coil and the second coil from each other, and a shield for shielding the first coil, the second coil, and the intermediate layer, wherein winding directions, of the first coil and the second coil are equal to each other; and at least one capacitor element connected to the coil block.

According to still another aspect of embodiments of the present invention, there is provided an amplifying device, which comprises an amplifying unit for amplifying an input signal to output an amplified signal; and a filter for filtering the amplified signal outputted from the amplifying unit; wherein the filter comprises a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other; and at least one capacitor element connected to the coil block.

According to still another aspect of embodiments of the present invention, there is provided an audio appliance, which comprises an audio providing unit for providing an audio signal; an amplifying unit for amplifying the audio signal to output the amplified audio signal; and a filter for filtering the amplified signal outputted from the amplifying unit; wherein the filter comprises a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other; and at least one capacitor element connected to the coil block.

According to still another aspect of embodiments of the present invention, there is provided an audio video (AV) appliance for outputting audio and video signals, which comprises an audio providing unit for providing an audio signal; an amplifying unit for amplifying the audio signal to output the amplified audio signal; and a filter for filtering the amplified signal outputted from the amplifying unit; wherein the filter comprises a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other; and at least one capacitor element connected to the coil block.

According to still another aspect of embodiments of the present invention, there is provided a power supply device, which comprises a pulse width modulation (PWM) generation unit for generating a PWM signal corresponding to a magnitude of power to be supplied; and an amplifier for amplifying and filtering the generated PWM signal; wherein the amplifier comprises an amplifying unit for amplifying the PWM signal to output the amplified PWM signal; and a filter for filtering the amplified signal outputted from the amplifying unit; wherein the filter comprises a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other; and at least one capacitor element connected to the coil block.

According to still another aspect of embodiments of the present invention, there is provided an electronic device, which comprises a function block for performing a specified function; and a power supply unit for supplying power to the function block, wherein the power supply unit comprises a pulse width modulation (PWM) generation unit for generating a PWM signal corresponding to a magnitude of the power to be supplied; and an amplifier for amplifying and filtering the generated PWM signal; wherein the amplifier comprises an amplifying unit for amplifying the PWM signal to output the amplified PWM signal; and a filter for filtering the amplified signal outputted from the amplifying unit; wherein the filter comprises a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other; and at least one capacitor element connected to the coil block.

According to still another aspect of embodiments of the present invention, there is provided a filtering device, which comprises a coil block having a first coil, a second coil, a core having an intermediate layer for separating the first coil and the second coil from each other, and a shield for shielding the first coil, the second coil, and the intermediate layer, wherein the shield is attached to a specified part of the core; and at least one capacitor element connected to the coil block.

According to still another aspect of embodiments of the present invention, there is provided an amplifying device, which comprises an amplifying unit for amplifying an input signal to output an amplified signal; and a filter for filtering the amplified signal outputted from the amplifying unit; wherein the filter comprises a coil block having a first coil, a second coil, a core having an intermediate layer for separating the first coil and the second coil from each other, and a shield for shielding the first coil, the second coil, and the intermediate layer, wherein the shield is attached to a specified part of the core; and at least one capacitor element connected to the coil block.

According to still another aspect of embodiments of the present invention, there is provided an audio appliance, which comprises an audio providing unit for providing an audio signal; an amplifying unit for amplifying the audio signal to output the amplified audio signal; and a filter for filtering the amplified signal outputted from the amplifying unit; wherein the filter comprises a coil block having a first coil, a second coil, a core having an intermediate layer for separating the first coil and the second coil from each other, and a shield for shielding the first coil, the second coil, and the intermediate layer, wherein the shield is attached to a specified part of the core; and at least one capacitor element connected to the coil block.

According to still another aspect of embodiments of the present invention, there is provided an audio video (AV) appliance for outputting audio and video signals, which comprises an audio providing unit for providing an audio signal; an amplifying unit for amplifying the audio signal to output the amplified audio signal; and a filter for filtering the amplified signal outputted from the amplifying unit; wherein the filter comprises a coil block having a first coil, a second coil, a core having an intermediate layer for separating the first coil and the second coil from each other, and a shield for shielding the first coil, the second coil, and the intermediate layer, wherein the shield is attached to a specified part of the core; and at least one capacitor element connected to the coil block.

According to still another aspect of embodiments of the present invention, there is provided a power supply device, which comprises a pulse width modulation (PWM) generation unit for generating a PWM signal corresponding to a magnitude of power to be supplied; and an amplifier for amplifying and filtering the generated PWM signal; wherein the amplifier comprises an amplifying unit for amplifying the PWM signal to output the amplified PWM signal; and a filter for filtering the amplified signal outputted from the amplifying unit; wherein the filter comprises a coil block having a first coil, a second coil, a core having an intermediate layer for separating the first coil and the second coil from each other, and a shield for shielding the first coil, the second coil, and the intermediate layer, wherein the shield is attached to a specified part of the core; and at least one capacitor element connected to the coil block.

According to still another aspect of embodiments of the present invention, there is provided an electronic device, which comprises a function block for performing a specified function; and a power supply unit for supplying power to the function block, wherein the power supply unit comprises a pulse width modulation (PWM) generation unit for generating a PWM signal corresponding to a magnitude of the power to be supplied; and an amplifier for amplifying and filtering the generated PWM signal; wherein the amplifier comprises an amplifying unit for amplifying the PWM signal to output the amplified PWM signal; and a filter for filtering the amplified signal outputted from the amplifying unit; wherein the filter comprises a coil block having a first coil, a second coil, a core having an intermediate layer for separating the first coil and the second coil from each other, and a shield for shielding the first coil, the second coil, and the intermediate layer, wherein the shield is attached to a specified part of the core; and at least one capacitor element connected to the coil block.

BRIEF DESCRIPTION OF THE DRAWINGS

The above and other exemplary features and advantages of the present invention will become more apparent from the following detailed description of certain exemplary embodiments thereof when taken in conjunction with the accompanying drawings, in which.

Throughout the drawings, like reference numbers should be understood to refer to like elements, features, and structures.

DETAILED DESCRIPTION OF EXEMPLARY EMBODIMENTS

The matters exemplified in this description are provided to assist in a comprehensive understanding of various exemplary embodiments of the present invention disclosed with reference to the accompanying figures. Accordingly, those of ordinary skill in the art will recognize that various changes and modifications of the exemplary embodiments described herein can be made without departing from the scope and spirit of the claimed invention. Descriptions of well-known functions and constructions are omitted for clarity and conciseness.

Figure 3A:
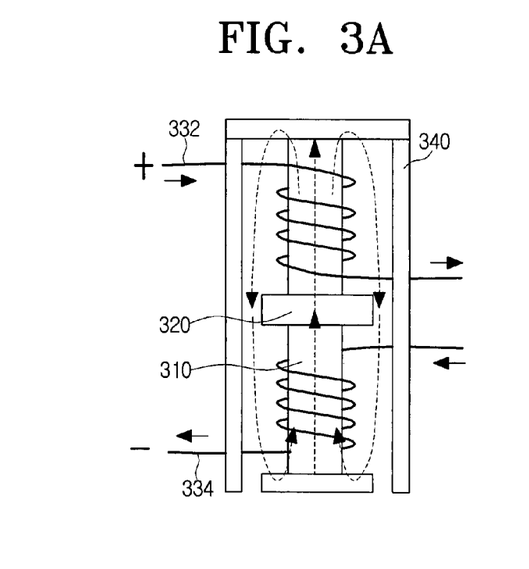
FIGS. 3A and 3B are views illustrating the structure of a coil block and explaining the operation of the coil block according to an embodiment of the present invention.
Figure 3B:
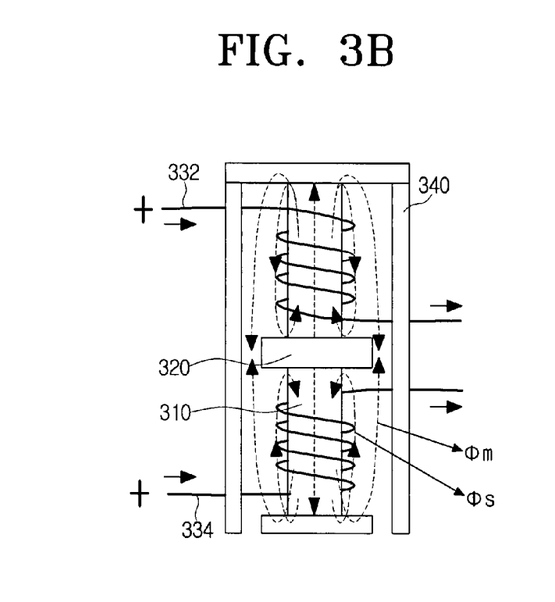

FIGS. 3A and 3B are views illustrating the structure of a coil block and explaining the operation of the coil block according to an embodiment of the present invention.

The coil block according to an embodiment of the present invention forms a coil package which comprises a first coil 332, a second coil 334, a core 310 having an intermediate layer 320 for separating the first coil 332 and the second coil 334 from each other, and a shield 340 for shielding the first coil 332, the second coil 334, and the intermediate layer 320, wherein the first coil and the second coil have the same winding direction.

Here, the directions of current being applied to the first coil 332 and the second coil 334 may be opposite to each other as shown in FIG. 3A, or may be equal to each other as shown in FIG. 3B.

As shown in FIG. 3A, the coil block is shielded by the shield 340 around the core 310. Here, the shield 340 is in the form of a square pillar, and may have another shape such as a cylinder. The shield 340 may be made of the same material as the core 310.

As shown in FIG. 3a, the shield 340 is attached to an upper plate provided on the core 310, and particularly, it is attached to an edge of the lower surface of the upper plate. For this, the area of the upper plate is larger than that of a lower plate. In constructing the coil block, the shield 340 may be attached to another part of the upper plate instead of the edge of the lower surface of the upper plate or the upper plate and the shield may be formed as a single integral piece.

The shield 340 and the intermediate layer 320 are apart from each other. In this case, the shield 340 and the intermediate layer 320 may be apart from each other as a whole, or only a portion of the shield 340 and the intermediate layer 320 may be apart from each other. The reason why the intermediate layer 320 and the shield 340 are apart from each other is to make the magnetic forces generated from the first coil 332 and the second coil 334 induced into one without interruption in the case where the directions of current flowing through the first coil and the second coil are opposite to each other. The core 310 and the intermediate layer 320 may be formed as a single body or may be formed separately and attached to each other furthermore, they may be made of the same material. Also, it is preferable that the intermediate layer 320 and the shield 340 are made of an electromagnetic shielding material.

In FIGS. 3A and 3B, the winding directions of the first coil 332 and the second coil 334 are equal to each other, irrespective of the directions of current. That is, as shown in FIG. 3A, although the directions of current being applied to the first coil 332 and the second coil 334 are different from each other, their winding directions are equal to each other. Also, as shown in FIG. 3B, the directions of current being applied to the first coil 332 and the second coil 334 are equal to each other, and the winding directions thereof are also equal to each other.

The inductances of the first coil 332 and the second coil 334 may be equal to each other, or may be different from each other.

Figure 3C:
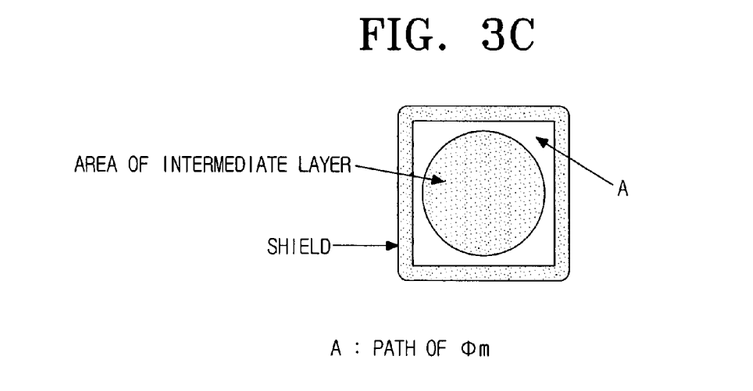
FIG. 3C is a view illustrating a magnetic force flow path for mutual inductance.

FIG. 3C is a view illustrating a magnetic force flow path for mutual inductance. As shown in FIG. 3C, in accordance with the size of a gap between the shield 340 and the intermediate layer 320, i.e., the area of the magnetic force flow path, the magnitude of the inductance is controlled. Since the inductance of a coil is in proportion to the amount of flux, the magnitude of the self inductance can be controlled by adjusting the area A of the path. Here, if the area A of the magnetic flux path is decreased, the self inductance is increased, while if the area A is increased, the self inductance is decreased.

Figure 4:
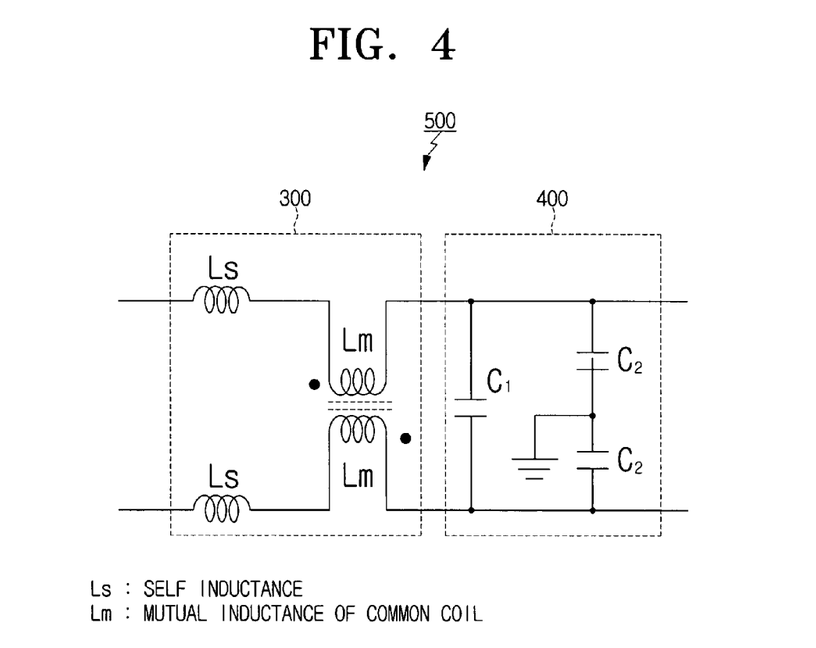
FIG. 4 is a circuit diagram of an equivalent circuit of an LC filter using a coil block according to an embodiment of the present invention.

FIG. 4 is a circuit diagram of an equivalent circuit of an LC filter using a coil block according to an embodiment of the present invention.

The coil block 300 as illustrated in FIG. 4 is an equivalent circuit of the coil block as illustrated in FIGS. 3A and 3B. As shown in FIG. 4, an LC filter 500 is provided with a coil block 300 and a capacitor unit 400.

If inputs of the LC filter 500 have the inversed phase (e.g., a positive current flows to the first coil 332 and a negative current flows to the second coil 334, and vice versa), the self inductance Ls becomes 2 Ls, and the mutual inductance Lm becomes 4 Lm. Accordingly, the whole inductance generated in the coil block 300 becomes 2 Ls+4 Lm.

On the other hand, if inputs of the LC filter 500 have the same phase (e.g., a positive current flows to the first coil 332 and the second coil 334, or a negative current flows to the first coil 332 and the second coil 334), the magnetic force generated from the first coil 332 and the magnetic force generated from the second coil 334 meet each other in the space between the intermediate layer 320 and the shield 340. Accordingly, the mutual inductance components Lm are offset and disappear, and thus the whole inductance generated from the coil block 300 becomes 2 Ls.

The capacitances of capacitors C1 and C2 in the capacitor unit 400 are determined according to the inductances generated from the coil block 300. Specifically, the capacitance of the capacitor C1 is determined according to 2 Ls+4 Lm. If 2 Ls+4 Lm is large, the capacitance of the capacitor C1 is determined to be small, while if 2 Ls+4 Lm is small, the capacitance of the capacitor C1 is determined to be large.

Also, the capacitance of the capacitor C2 is determined according to 2 Ls . Specifically, if 2 Ls is large, the capacitance of the capacitor C2 is determined to be small, while if 2 Ls is small, the capacitance of the capacitor C2 is determined to be large.

It is possible that the capacitor unit 400 of the coil block 300 as shown in FIG. 4 is implemented by capacitors the number of which is different from that as shown or by capacitors differently arranged.

Figure 5A:
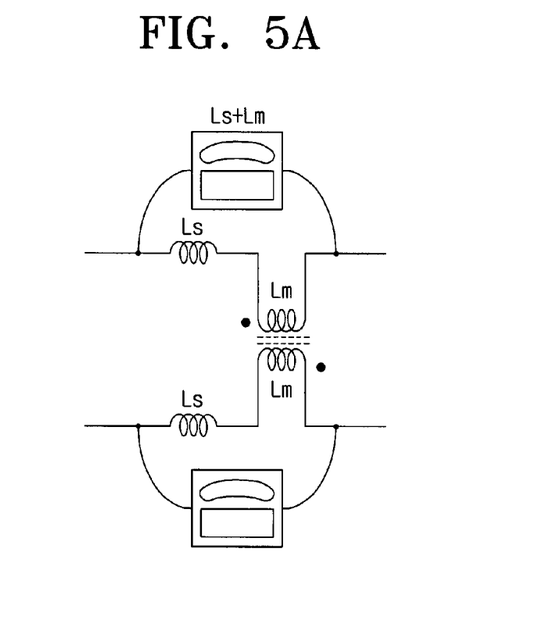
FIG. 5A is a view explaining a method of measuring respective inductances.

FIG. 5A is a view explaining a method of measuring respective inductances.

As shown in FIG. 5A, in order to measure the inductance generated in the first coil 332, one terminal of a measuring instrument is connected to an input terminal of the coil block and the other terminal thereof is connected to an output terminal of the coil block. Accordingly, the inductance generated in the first coil 332 becomes Ls+Lm that is the sum of the self inductance Ls and the mutual inductance Lm.

Also, in order to measure the inductance generated in the second coil 334, one terminal of the measuring instrument is connected to an input terminal of the coil block and the other terminal thereof is connected to an output terminal of the coil block. Accordingly, the inductance generated in the second coil 334 becomes Ls+Lm since the self inductance Ls and the mutual inductance Lm are connected in series.

Figure 5B:
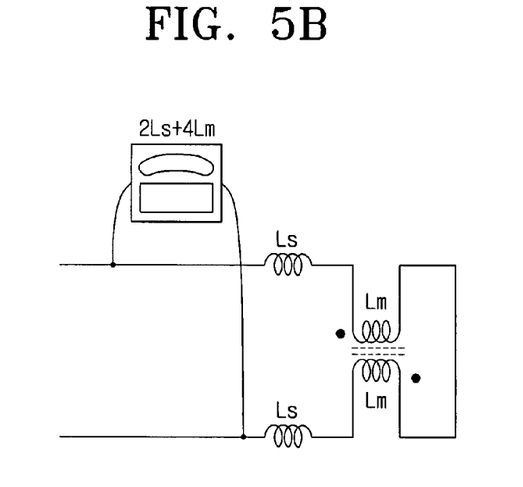
FIG. 5B is a view explaining a method of measuring a coil inductance in the case where a PWM signal has an inversed phase.

FIG. 5B is a view explaining a method of measuring a coil inductance in the case where a PWM signal has an inversed phase.

If a PWM signal inputted to the coil block has an inversed phase, the directions of current being applied to the first coil 332 and the second coil 334 are opposite to each other. In this case, the measurement of the inductance is performed by connecting one terminal of the measuring instrument to the input terminal of the first coil 332 and connecting the other terminal thereof to the input terminal of the second coil 334 in a state that the output terminals of the first coil 332 and the second coil 334 are connected together.

Accordingly, in the case where the PWM signal has the inversed phase, the whole inductance becomes 2 Ls+4 Lm which is the sum of two times the self inductance 2 Ls and four times the mutual inductance 4 Lm.

Figure 5C:
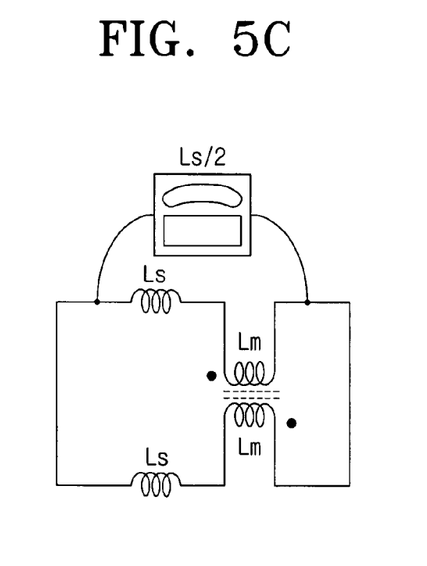
FIG. 5C is a view explaining a method of measuring a coil inductance in the case where a PWM signal has the same phase.

FIG. 5C is a view explaining a method of measuring a coil inductance in the case where a PWM signal has the same phase.

If the PWM signal inputted to the coil block has the same phase, the directions of current being applied to the first coil 332 and the second coil 334 are equal to each other. In this case, the measurement of the inductance is performed in a state that the input terminals of the first coil 332 and the second coil 334 are connected together and the output terminals of the first coil 332 and the second coil 334 are connected together.

Since the inductances generated in the first coil 332 and the second coil 334 are connected in parallel, one terminal of the measuring instrument is connected to the input terminal of the first coil 332 and the other terminal thereof is connected to the output terminal of the first coil 332. It is also possible that one terminal of the measuring instrument is connected to the input terminal of the second coil 334 and the other terminal thereof is connected to the output terminal of the second coil 334.

Accordingly, since the mutual inductances are offset, the whole inductance becomes Ls/2 that is obtained by dividing the self inductance by 2.

Figure 6:
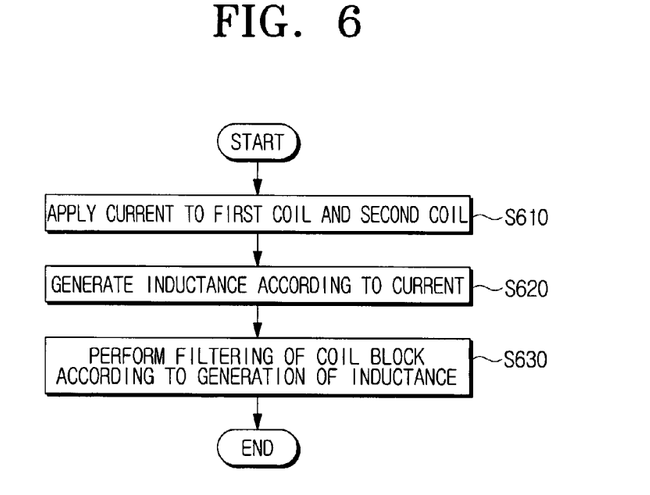
FIG. 6 is a flowchart illustrating a filtering method performed by an LC filter using a coil block according to an embodiment of the present invention.

FIG. 6 is a flowchart illustrating a filtering method performed by an LC filter using a coil block according to an embodiment of the present invention.

The coil block according to the present invention forms the coil package which comprises the first coil 332, the second coil 334, the core 310 having the intermediate layer 320 for separating the first coil 332 and the second coil 334 from each other, and the shield 340 for shielding the first coil 332, the second coil 334, and the intermediate layer 320, wherein the shield 340 and the intermediate layer 320 are apart from each other for a predetermined gap.

Current flows to the first coil 332 and the second coil 334 of the coil block as constructed above at step (S610).

At this time, the directions of current being applied to the first coil 332 and the second coil 334 may be equal to or opposite to each other.

Then, inductances are generated in the first coil 332 and the second coil 334 as the current flows through the coils at step (S620).

Here, in the case where the directions of the current being applied to the first coil 332 and the second coil 334 are different from each other as shown in FIG. 3A, the direction of the magnetic force generated by the first coil 332 becomes equal to the that of the magnetic force induced by the second coil 334.

On the other hand, in the case where the directions of the current being applied to the first coil 332 and the second coil 334 are equal to each other as shown in FIG. 3B, a part of the magnetic force generated by the first coil 332 is interrupted by the intermediate layer 320, and a part of the magnetic force generated by the second coil 334 is interrupted. Other parts of the magnetic forces generated by the first coil 332 and the second coil 334 are applied in the space between the shield 340 and the intermediate layer 320. Accordingly, the part of the magnetic force from the first coil 332 and the part of the magnetic force from the second coil 334 are offset in the space.

In this case, the magnitude of the inductance is controlled according to the size of the space between the shield 340 and the intermediate layer 320.

Here, if the self inductance is Ls, the mutual inductance is Lm, and the directions of current being applied to the first coil 332 and the second coil 334 are equal to each other, the whole inductance becomes Ls/2.

Also, if the self inductance is Ls, the mutual inductance is Lm, and the directions of current being applied to the first coil 332 and the second coil 334 are opposite to each other, the whole inductance becomes 2 Ls+4 Lm.

Thereafter, the filtering operation is performed by the inductance generated by the coils of the coil block and the capacitance generated by the capacitors at step (S630). In this case, the filtering is performed irrespective of whether the PWM signal inputted to the coil block has the inversed phase or the same phase, and the performance of filtering can be controlled according to the magnitude of the inductance.

As described above, the coil block according to the present invention has the whole inductance of Ls/2 even if the PWM signal of the same phase is applied, and thus it can serve as a filter. According to the conventional technique, if the PWM signal of the same phase is applied, the inductances are offset, and thus no filtering operation can be performed.

Till now, the coil block and the LC filter using the coil block according to an embodiment of the present invention have been described in detail. The coil block according to the present invention can be applied to any electronic device that requires the inductance in addition to the LC filter.

In addition, the LC filter implemented using the coil block as described above can also be applied to diverse electronic devices. A digital amplifier may be a representative example of an electronic device using the LC filter. Further, this digital amplifier may be applied to an audio appliance or an AV appliance that outputs an audio signal. The audio appliance may be an MP3 player, a home theater, and so forth, and the AV appliance may be a television receiver, a personal multimedia player (PMP), and so forth.

Figure 7:
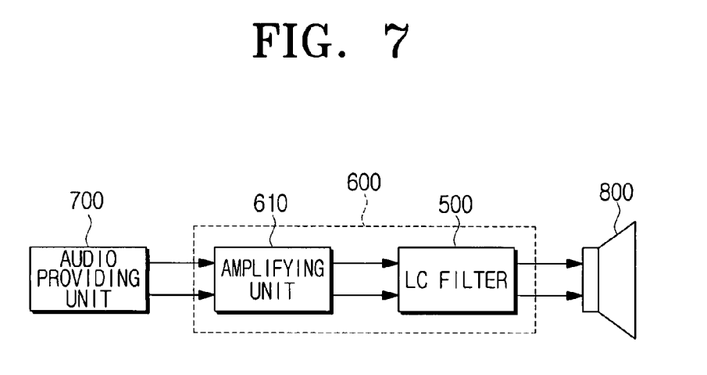
FIG. 7 is a block diagram schematically illustrating the construction of a digital amplifier and an audio appliance using the digital amplifier according to another embodiment of the present invention.

FIG. 7 is a block diagram schematically illustrating the construction of a digital amplifier 600 using an LC filter 500, and an audio appliance using the digital amplifier according to another embodiment of the present invention. As shown in FIG. 7, the digital amplifier 600 comprises an amplifying unit 610 for amplifying an audio signal, an LC filter 500 for filtering high-frequency components of the audio signal amplified by the amplifying unit 610 to output the filtered audio signal to a speaker 800.

The audio appliance may further comprise an audio providing unit 700 for providing the self-reproduced or externally inputted audio signal to the digital amplifier 600, in addition to the digital amplifier 600 and the speaker 800.

On the other hand, by combining a video appliance with the audio appliance as illustrated in FIG. 7, it is possible to implement an AV appliance.

Figure 8:
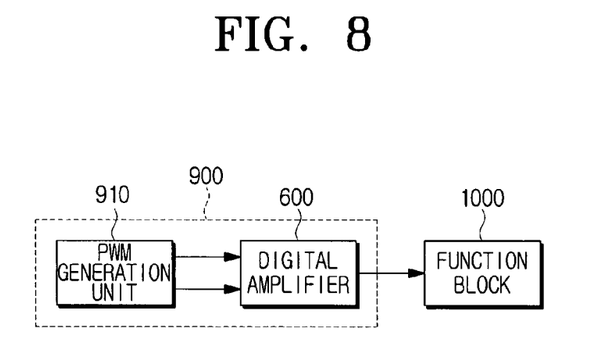
FIG. 8 is a block diagram illustrating the construction of a power supply device and an electronic appliance using the power supply device according to still another embodiment of the present invention.

FIG. 8 is a block diagram illustrating the construction of a power supply device 900 composed of a digital amplifier implemented using the LC filter 500 and a PWM generation unit 910, and an electronic appliance provided with the power supply device 900 according to still another embodiment of the present invention. As illustrated in FIG. 8, the power supply device 900 comprises the PWM generation unit 910 for generating the PWM signal corresponding to the magnitude of the power to be supplied, and the digital amplifier 600 for amplifying and filtering the PWM signal generated by the PWM generation unit 910 to output a stable power having a desired magnitude. The power outputted from the power supply device 900 is applied to a function block 1000 performing a specified function (e.g., including tuning, signal processing, reproduction, storage, video output, audio output, and so forth)

As described above, according to the present invention, the filtering can be performed without any inductance offset even if the PWM signal having the inversed phase or the same phase is inputted.

In addition, since two windings having the small number of turns, they can be wound on to one core using the common coil, the cost and the size of the coil block can be reduced.

While the present invention has been particularly shown and described with reference to certain exemplary embodiments thereof, it will be understood by those of ordinary skill in the art that various changes in form and detail may be made therein without departing from the spirit and scope of the present invention as defined by the appended claims and equivalents thereof.

What is claimed is:

1. A coil block comprising:
   a first coil;
   a second coil;
   a core having an intermediate layer for separating the first coil and the second coil from each other; and
   a shield for shielding the first coil, the second coil, and the intermediate layer; wherein the first coil and the second coil have the same winding direction,
   wherein the shield is attached to an upper plate provided on the core,
   wherein an area of the upper plate is larger than an area of a lower plate provided on the core, and
   wherein if directions of current being applied to the first coil and the second coil are different from each other, a direction of a magnetic force induced by the first coil is equal to a direction of a magnetic force induced by the second coil, and
   if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

2. The coil block of claim 1, wherein the shield and the intermediate layer are entirely or partly apart from each other.

3. The coil block of claim 1, wherein the shield is in the form of a square pillar.

4. The coil block of claim 1, wherein the first coil and the second coil have the same inductance.

5. The coil block of claim 1, wherein the first coil and the second coil have different inductances from each other.

6. The coil block of claim 1, wherein the intermediate layer and the core are made of the same material.

7. The coil block of claim 1, wherein the intermediate layer and the core are formed as a single body.

8. The coil block of claim 1, wherein the intermediate layer is made of an electromagnetic shielding material.

9. The coil block of claim 1, wherein the shield is made of the same material as the core.

10. The coil block of claim 1, wherein the shield is made of an electromagnetic shielding material.

11. The coil block of claim 1, wherein if directions of current being applied to the first coil and the second coil are equal to each other, a part of magnetic force is applied through a predetermined gap between the shield and the intermediate layer to be offset, and another part of the magnetic force causes generation of self inductance between the shield and the first coil and between the shield and the second coil.

12. The coil block of claim 1, wherein the magnitude of inductance is controlled according to the size of the gap between the shield and the intermediate layer.

13. The coil block of claim 1, wherein the magnitude of inductance is controlled according to an area of a magnetic force flow path of the first coil and the second coil.

14. The coil block of claim 1, wherein the intermediate layer and the core are attached to each other.

15. A coil block comprising:
   a first coil;
   a second coil;
   a core having an intermediate layer for separating the first coil and the second coil from each other; and
   a shield for shielding the first coil, the second coil, and the intermediate layer;
   wherein the shield is attached to a portion of the core,
   wherein the shield is attached to an upper plate provided on the core,
   wherein an area of the upper plate is larger than an area of a lower plate provided on the core, and
   wherein if directions of current being applied to the first coil and the second coil are different from each other, a direction of a magnetic force induced by the first coil is equal to a direction of a magnetic force induced by the second coil, and
   if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

16. The coil block of claim 15, wherein the shield is attached to an edge of a lower surface of the upper plate.

17. The coil block of claim 15, wherein the shield and the intermediate layer are entirely or partly apart from each other.

18. The coil block of claim 15, wherein the shield is in the form of a square.

19. The coil block of claim 15, wherein the first coil and the second coil have the same inductance.

20. The coil block of claim 15, wherein the first coil and the second coil have different inductances from each other.

21. The coil block of claim 15, wherein the intermediate layer and the core are made of the same material.

22. The coil block of claim 15, wherein the intermediate layer and the core are formed as a single body.

23. The coil block of claim 15, wherein the intermediate layer is made of an electromagnetic shielding material.

24. The coil block of claim 15, wherein the shield is made of the same material as the core.

25. The coil block of claim 15, wherein the shield is made of an electromagnetic shielding material.

26. The coil block of claim 15, wherein if directions of current being applied to the first coil and the second coil are equal to each other, a part of magnetic force is applied through a predetermined gap between the shield and the intermediate layer to be offset, and another part of the magnetic force causes generation of self inductance between the shield and the first coil and between the shield and the second coil.

27. The coil block of claim 15, wherein the magnitude of inductance is controlled according to the size of the gap between the shield and the intermediate layer.

28. The coil block of claim 15, wherein the magnitude of inductance is controlled according to an area of a magnetic force flow path of the first coil and the second coil.

29. The coil block of claim 15, wherein the intermediate layer and the core are attached to each other.

30. A filtering device comprising:
a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other; and
at least one capacitor element connected to the coil block, wherein the shield is attached to an upper plate provided on the core,
wherein an area of the upper plate is larger than an area of a lower plate provided on the core, and
wherein if directions of current being applied to the first coil and the second coil are different from each other, a direction of a magnetic force induced by the first coil is equal to a direction of a magnetic force induced by the second coil, and
if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

31. An amplifying device comprising:
an amplifying unit for amplifying an input signal to output an amplified signal; and
a filter for filtering the amplified signal outputted from the amplifying unit; wherein the filter comprises:
a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other; and
at least one capacitor element connected to the coil block, wherein the shield is attached to an upper plate provided on the core,
wherein an area of the upper plate is larger than an area of a lower plate provided on the core, and
wherein if directions of current being applied to the first coil and the second coil are different from each other, a direction of a magnetic force induced by the first coil is equal to a direction of a magnetic force induced by the second coil, and
if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

32. An audio appliance comprising:
an audio providing unit for providing an audio signal;
an amplifying unit for amplifying the audio signal to output the amplified audio signal; and
a filter for filtering the amplified signal outputted from the amplifying unit; wherein the filter comprises:
a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other; and
at least one capacitor element connected to the coil block, wherein the shield is attached to an upper plate provided on the core,
wherein an area of the upper plate is larger than an area of a lower plate provided on the core, and
wherein if directions of current being applied to the first coil and the second coil are different from each other, a direction of a magnetic force induced by the first coil is equal to a direction of a magnetic force induced by the second coil, and
if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

33. An audio video (AV) appliance for outputting audio and video signals, comprising:
an audio providing unit for providing an audio signal;
an amplifying unit for amplifying the audio signal to output the amplified audio signal; and
a filter for filtering the amplified signal outputted from the amplifying unit; wherein the filter comprises:
a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other; and
at least one capacitor element connected to the coil block, wherein the shield is attached to an upper plate provided on the core,
wherein an area of the upper plate is larger than an area of a lower plate provided on the core, and
wherein if directions of current being applied to the first coil and the second coil are different from each other, a direction of a magnetic force induced by the first coil is equal to a direction of a magnetic force induced by the second coil, and
if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

34. A power supply device comprising:
a pulse width modulation (PWM) generation unit for generating a PWM signal corresponding to a magnitude of power to be supplied; and
an amplifier for amplifying and filtering the generated PWM signal; wherein the amplifier comprises:

an amplifying unit for amplifying the PWM signal to output the amplified PWM signal; and
a filter for filtering the amplified signal outputted from the amplifying unit; wherein the filter comprises:
a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other; and
at least one capacitor element connected to the coil block,
wherein the shield is attached to an upper plate provided on the core,
wherein an area of the upper plate is larger than an area of a lower plate provided on the core, and
wherein if directions of current being applied to the first coil and the second coil are different from each other, a direction of a magnetic force induced by the first coil is equal to a direction of a magnetic force induced by the second coil, and
if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

35. An electronic device comprising:
a function block for performing a specified function; and
a power supply unit for supplying power to the function block;
wherein the power supply unit comprises:
a pulse width modulation (PWM) generation unit for generating a PWM signal corresponding to a magnitude of the power to be supplied; and
an amplifier for amplifying and filtering the generated PWM signal; wherein the amplifier comprises:
an amplifying unit for amplifying the PWM signal to output the amplified PWM signal; and
a filter for filtering the amplified signal outputted from the amplifying unit; wherein the filter comprises:
a coil block having a first coil, a second coil, a core having an intermediate layer for separating the first coil and the second coil from each other, and a shield for shielding the first coil, the second coil, and the intermediate layer, wherein winding directions of the first coil and the second coil are equal to each other, and
at least one capacitor element connected to the coil block,
wherein the shield is attached to an upper plate provided on the core,
wherein an area of the upper plate is larger than an area of a lower plate provided on the core, and
wherein if directions of current being applied to the first coil and the second coil are different from each other, a direction of a magnetic force induced by the first coil is equal to a direction of a magnetic force induced by the second coil, and
if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

36. A filtering device comprising:
a coil block having a first coil, a second coil, a core having an intermediate layer for separating the first coil and the second coil from each other, and a shield for shielding the first coil, the second coil, and the intermediate layer, wherein the shield is attached to a specified part of the core; and
at least one capacitor element connected to the coil block,
wherein the shield is attached to an upper plate provided on the core,
wherein an area of the upper plate is larger than an area of a lower plate provided on the core, and
wherein if directions of current being applied to the first coil and the second coil are different from each other, a direction of a magnetic force induced by the first coil is equal to a direction of a magnetic force induced by the second coil, and
if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

37. An amplifying device comprising:
an amplifying unit for amplifying an input signal to output an amplified signal; and
a filter for filtering the amplified signal outputted from the amplifying unit; wherein the filter comprises:
a coil block having a first coil, a second coil, a core having an intermediate layer for separating the first coil and the second coil from each other, and a shield for shielding the first coil, the second coil, and the intermediate layer, wherein the shield is attached to a specified part of the core; and
at least one capacitor element connected to the coil block,
wherein the shield is attached to an upper plate provided on the core,
wherein an area of the upper plate is larger than an area of a lower plate provided on the core, and
wherein if directions of current being applied to the first coil and the second coil are different from each other, a direction of a magnetic force induced by the first coil is equal to a direction of a magnetic force induced by the second coil, and
if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

38. An audio appliance comprising:
an audio providing unit for providing an audio signal;
an amplifying unit for amplifying the audio signal to output the amplified audio signal; and
a filter for filtering the amplified signal outputted from the amplifying unit; wherein the filter comprises, a coil block having a first coil, a second coil, a core having an intermediate layer for separating the first coil and the second coil from each other, and a shield for shielding the first coil, the second coil, and the intermediate layer, wherein the shield is attached to a specified part of the core, and at least one capacitor element connected to the coil block, wherein the shield is attached to an upper plate provided on the core, wherein an area of the upper plate is larger than an area of a lower plate provided on the core, and wherein if directions of current being applied to the first coil and the second coil are different from each other, a direction of a magnetic force induced by the first coil is equal to a direction of a magnetic force induced by the second coil, and if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

39. An audio video (AV) appliance for outputting audio and video signals, comprising:

an audio providing unit for providing an audio signal;

an amplifying unit for amplifying the audio signal to output the amplified audio signal; and a filter for filtering the amplified signal outputted from the amplifying unit; wherein the filter comprises:

a coil block having a first coil, a second coil, a core having an intermediate layer for separating the first coil and the second coil from each other, and a shield for shielding the first coil, the second coil, and the intermediate layer, wherein the shield is attached to a specified part of the core; and at least one capacitor element connected to the coil block, wherein the shield is attached to an upper plate provided on the core, wherein an area of the upper plate is larger than an area of a lower plate provided on the core, and wherein if directions of current being applied to the first coil and the second coil are different from each other, a direction of a magnetic force induced by the first coil is equal to a direction of a magnetic force induced by the second coil, and if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

40. A power supply device comprising:

a pulse width modulation (PWM) generation unit for generating a PWM signal corresponding to a magnitude of power to be supplied; and an amplifier for amplifying and filtering the generated PWM signal; wherein the amplifier comprises:

an amplifying unit for amplifying the PWM signal to output the amplified PWM signal; and a filter for filtering the amplified signal outputted from the amplifying unit; wherein the filter comprises:

a coil block having a first coil, a second coil, a core having an intermediate layer for separating the first coil and the second coil from each other, and a shield for shielding the first coil, the second coil, and the intermediate layer, wherein the shield is attached to a specified part of the core; and at least one capacitor element connected to the coil block, wherein the shield is attached to an upper plate provided on the core, an area of the upper plate is larger than an area of a lower plate provided on the core, and wherein if directions of current being applied to the first coil and the second coil are different from each other, a direction of a magnetic force induced by the first coil is equal to a direction of a magnetic force induced by the second coil, and if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

41. An electronic device, which comprises: a function block for performing a specified function; and a power supply unit for supplying power to the function block;

wherein the power supply unit comprises:

a pulse width modulation (PWM) generation unit for generating a PWM signal corresponding to a magnitude of the power to be supplied; and an amplifier for amplifying and filtering the generated PWM signal; wherein the amplifier comprises:

an amplifying unit for amplifying the PWM signal to output the amplified PWM signal; and a filter for filtering the amplified signal outputted from the amplifying unit; wherein the filter comprises:

a coil block having a first coil, a second coil, a core having an intermediate layer for separating the first coil and the second coil from each other, and a shield for shielding the first coil, the second coil, and the intermediate layer, wherein the shield is attached to a specified part of the core; and at least one capacitor element connected to the coil block, wherein the shield is attached to an upper plate provided on the core, an area of the upper plate is larger than an area of a lower plate provided on the core, and wherein if directions of current being applied to the first coil and the second coil are different from each other, a direction of a magnetic force induced by the first coil is equal to a direction of a magnetic force induced by the second coil, and if a direction of current being applied to the first coil and the second coil are the same, a part of the magnetic force generated by the first coil is interrupted by the intermediate layer and a part of the magnetic force generated by the second coil is interrupted, another part of magnetic forces generated by the first coil and the second coil are applied in a space between the shield and the intermediate layer so that the part of the magnetic force from the first coil and the part of the magnetic force from the second coil are offset in the space.

* * * * *